United States Patent [19]
Maeda et al.

[11] Patent Number: 5,532,193
[45] Date of Patent: Jul. 2, 1996

[54] METHOD FOR FORMING INSULATING FILM

[75] Inventors: Kazuo Maeda; Noboru Tokumasu; Yoshiaki Yuyama, all of Tokyo, Japan

[73] Assignees: Canon Sales Co., Inc.; Alcan-Tech Co., Inc.; Semiconductor Process Laboratory Co., Ltd., all of, Japan

[21] Appl. No.: 331,737

[22] Filed: Oct. 31, 1994

[30] Foreign Application Priority Data

Nov. 10, 1993 [JP] Japan .................................. 5-281157

[51] Int. Cl.$^6$ .................................................. H01L 21/02
[52] U.S. Cl. ..................... 437/243; 427/126.2; 427/255; 427/255.3; 427/314; 427/419.2
[58] Field of Search ........................... 427/126.2, 255, 427/255.3, 314, 419.2; 437/243

[56] References Cited

U.S. PATENT DOCUMENTS

| | | | |
|---|---|---|---|
| 3,837,935 | 9/1974 | Maeda et al. ........................... | 148/187 |
| 4,892,753 | 1/1990 | Wong et al. ............................ | 427/38 |
| 5,104,482 | 4/1992 | Mankowski et al. .................. | 156/643 |
| 5,281,295 | 1/1994 | Maeda et al. .......................... | 156/345 |
| 5,324,539 | 6/1994 | Maeda et al. .......................... | 427/255.3 |
| 5,376,591 | 12/1994 | Maeda et al. .......................... | 437/238 |

Primary Examiner—Benjamin Utech
Attorney, Agent, or Firm—Lorusso & Loud

[57] ABSTRACT

The invention relates to a method for forming a BSG film by means of chemical vapor deposition, has an object which is to provide a film forming method making it possible to obtain a BSG film of high denseness and of low hygroscopicity even immediately after the film has been formed at a low temperature, and comprises a process of forming a borosilicate glass film (BSG film) on a substrate using a mixed gas of an organometallic compound having Si—O—B bond and ozone ($O_3$).

12 Claims, 8 Drawing Sheets

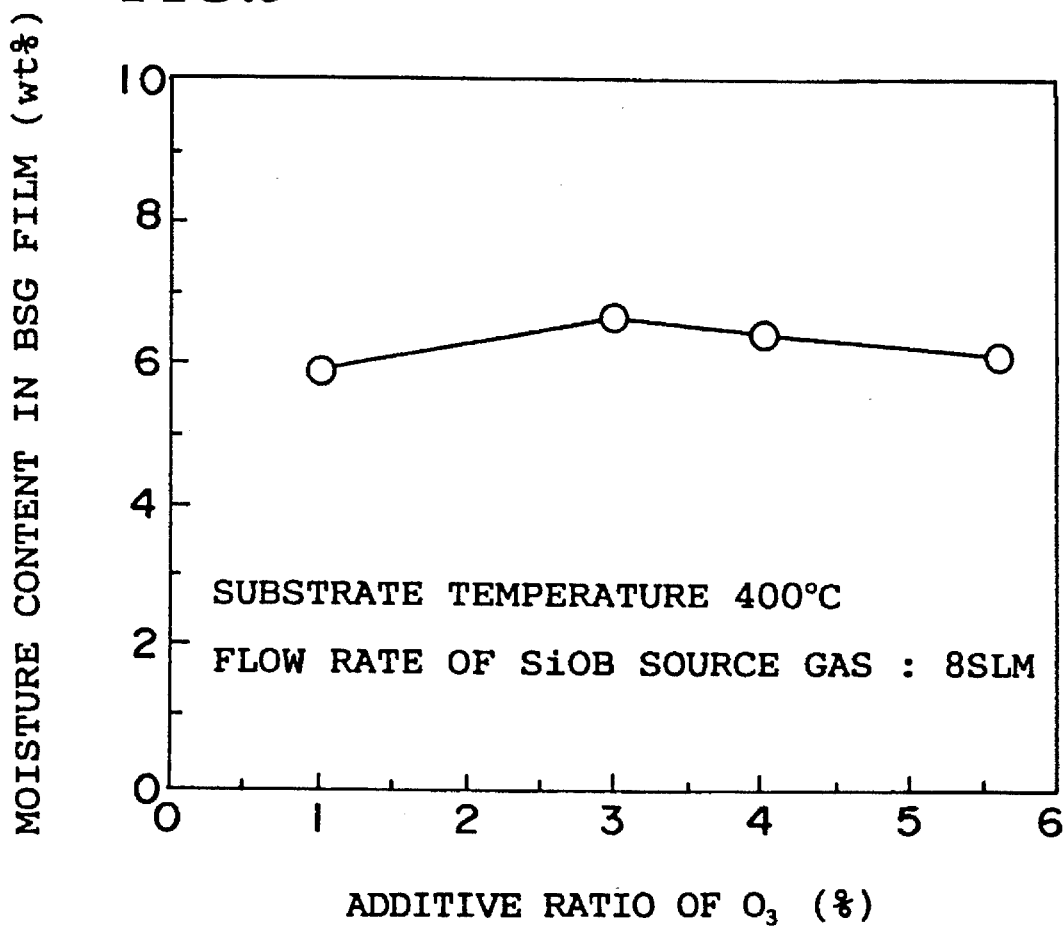

FIG.6

| No. | SiOB SOURCE | Si/B RATIO |
|---|---|---|
| 1 | $(R_3SiO)_3B$<br><br>Structure: Central B with three $OSi(CH_3)_3$ groups | $\dfrac{Si}{B} = \dfrac{3}{1} = 3$ |
| 2 | $(R_3SiO)_2BOB(OSiR_3)_2$<br><br>Structure: B–O–B with two $OSi(CH_3)_3$ groups on each B | $\dfrac{Si}{B} = \dfrac{4}{2} = 2$ |
| 3 | $(R_3SiO)_2BOSiR_2OB(OSiR_3)_2$<br><br>Structure: B–O–Si(CH$_3$)$_2$–O–B with two $OSi(CH_3)_3$ groups on each B | $\dfrac{Si}{B} = \dfrac{5}{2} = 2.5$ |
| 4 | $(R_3SiO)_2BR$<br><br>Structure: $(CH_3)_3Si$–O–B(CH$_3$)–O–Si(CH$_3$)$_3$ | $\dfrac{Si}{B} = \dfrac{2}{1} = 2$ |
| 5 | $(R_3SiO)BR_2$<br><br>Structure: $(CH_3)_3Si$–O–B(CH$_3$)$_2$ | $\dfrac{Si}{B} = \dfrac{1}{1} = 1$ |

FIG.7

| No. | SiOB SOURCE |
|---|---|
| 6 | $[(C_2H_5)Si(CH_3)_2O]_3B$ |
| 7 | $[(C_2H_5)_2Si(CH_3)O]_3B$ |
| 8 | $[(C_2H_5)_3SiO]_3B$ |
| 9 | $[(n-C_3H_7)_2Si(CH_3)O]_3B$ |
| 10 | $[(n-C_3H_7)_2Si(C_2H_5)O]_3B$ |
| 11 | $[(n-C_3H_7)_3SiO]_3B$ |
| 12 | $[(n-C_4H_9)_2Si(C_2H_5)O]_3B$ |
| 13 | $[(n-C_5H_{11})_2Si(CH_3)O]_3B$ |
| 14 | $[(n-C_4H_9)_3SiO]_3B$ |
| 15 | $[(i-C_5H_{11})_2Si(C_2H_5)O]_3B$ |
| 16 | $[(C_6H_5)Si(C_2H_5)_2O]_3B$ |
| 17 | $[(C_6H_5)_2Si(CH_3)O]_3B$ |
| 18 | $[(C_6H_5)_2Si(C_2H_5)O]_3B$ |
| 19 | $[(CH_3)_2Si(Cl)O]_3B$ |
| 20 | $[(CH_3)_2Si(Br)O]_3B$ |
| 21 | $[(CH_3)_2Si(F)O]_3B$ |
| 22 | $[(C_2H_5)_2Si(Cl)O]_3B$ |
| 23 | $[(C_2H_5)_2Si(Br)O]_3B$ |
| 24 | $[(C_2H_5)_2Si(F)O]_3B$ |
| 25 | $(Cl_3SiO)_3B$ |
| 26 | $[(CH_3)_2Si(OC_2H_5)O]_3B$ |
| 27 | $[(C_6H_5)_3SiO]_3B$ |
| 28 | $[(C_2H_5)_3SiO]_2B(OCH_3)$ |
| 29 | $[(C_2H_5)_3SiO]_2B(CH_3)$ |
| 30 | $[(C_2H_5)_3SiO]_2B(CH_3)$ |
| 31 | $[(CH_3)_3SiO]_2B(C_3H_7)$ |
| 32 | $[(CH_3)_3SiO]_2B(C_6H_5)$ |
| 33 | $[(CH_3)_3SiO]_2B(CF_3C_2H_4)$ |
| 34 | $[(CH_3)_3SiO]_2B(m-CF_3C_6H_4)$ |
| 35 | $[(C_2H_5)_3SiO]_2B(Br)$ |
| 36 | $[(C_6H_5)B(OC_2H_5)OSi(CH_3)]_2O$ |
| 37 | $(C_2H_5O)[(CH_3)_2SiO]_3B(C_6H_5)(OC_2H_5)$ |
| 38 | $[(C_2H_5O)(C_6H_5)BOSi(CH_3)_2]_2O$ |
| 39 | $[(C_2H_5O)_2BOSi(CH_3)_2]_2O$ |
| 40 | $\begin{array}{c}H_2C-O\\ \phantom{(CH_3)HC-O}\diagdown\\ \phantom{xxxxxxx}B-O-Si(CH_3)_3\\ (CH_3)HC-O\diagup\end{array}$ |
| 41 | $\begin{array}{c}(CH_3)_2C-O\\ \phantom{(CH_3)_2C-O}\diagdown\\ \phantom{xxxxxxxxx}B-O-Si(CH_3)_3\\ (CH_3)_2C-O\diagup\end{array}$ |

FIG.8

| No. | SiOB SOURCE |
|---|---|
| 42 | $\begin{matrix} H_2C-O \\ H_2C \phantom{-O} \\ H_2C-O \end{matrix} \Big\rangle B-O-Si(CH_3)_3$ |
| 43 | $\begin{matrix} (CH_3)_2C-O \\ H_2C \phantom{-O} \\ (CH_3)HC-O \end{matrix} \Big\rangle B-O-Si(CH_3)_3$ |
| 44 | $\left[ \begin{matrix} (CH_3)_2C-O \\ H_2C \phantom{-O} \\ (CH_3)HC-O \end{matrix} \Big\rangle B-O \right]_2 Si(CH_3)_2$ |
| 45 | $[(CH_3)_3SiOBO]_3$ |
| 46 | $[(C_2H_5)_3SiOBO]_3$ |
| 47 | (6-membered ring) $CH_3, C_6H_5$-Si–O–Si-$CH_3, C_6H_5$, with O–B($C_6H_5$)–O completing the ring |
| 48 | (6-membered ring) $(C_2H_5)_2$Si–O–Si$(C_2H_5)_2$, with O–B($C_6H_5$)–O completing the ring |
| 49 | $(C_6H_5)_3SiOB$ —(6-membered N–B ring with NH, NH, HN and B–OSi$(C_6H_5)_3$)— $BOSi(C_6H_5)_3$ |

FIG.9

| No. | SiOB SOURCE |
|---|---|
| 50 | $(C_6H_5)_3SiOB$ in a six-membered ring with alternating B and N atoms; N substituents are $CH_3$, $CH_3$, $CH_3$; two B atoms bear $OSi(C_6H_5)_3$ groups and the third B bears $OSi(C_6H_5)_3$ |
| 51 | Same six-membered B-N ring as No. 50 but N substituents are $C_6H_5$, $C_6H_5$, $C_6H_5$; three B atoms each bear $OSi(C_6H_5)_3$ |
| 52 | $CH_3-\underset{\underset{O}{\mid}}{\overset{\overset{C_6H_5}{\mid}}{Si}}-O-\underset{\underset{B}{\mid}}{\overset{\overset{C_6H_5}{\mid}}{B}}-O$ <br> $O-B-O-\underset{\underset{C_6H_5}{\mid}}{\overset{\overset{C_6H_5}{\mid}}{Si}}-CH_3$ |
| 53 | $C_2H_5-\underset{\underset{O}{\mid}}{\overset{\overset{C_2H_5}{\mid}}{Si}}-O-\underset{\underset{B}{\mid}}{\overset{\overset{C_6H_5}{\mid}}{B}}-O$ <br> $O-B-O-\underset{\underset{C_2H_5}{\mid}}{\overset{\overset{C_6H_5}{\mid}}{Si}}-C_2H_5$ |
| 54 | $C_6H_5-\underset{\underset{O}{\mid}}{\overset{\overset{CH_3}{\mid}}{Si}}-O-\underset{\underset{O}{\mid}}{\overset{\overset{CH_3}{\mid}}{Si}}-C_6H_5$ <br> $C_6H_5-B-O-\underset{\underset{C_6H_5}{\mid}}{\overset{}{Si}}-CH_3$ |
| 55 | $C_6H_5-\underset{\underset{O}{\mid}}{\overset{\overset{CH_3}{\mid}}{Si}}-O-\underset{}{\overset{\overset{CH_3}{\mid}}{Si}}-\overset{C_6H_5}{\underset{}{O}}$ <br> $\phantom{C_6H_5-Si-O-}B-C_6H_5$ <br> $H_3C-\underset{\underset{C_6H_5}{\mid}}{\overset{}{Si}}-O-\underset{\underset{CH_3}{\mid}}{\overset{}{Si}}-\overset{C_6H_5}{\underset{}{O}}$ |

METHOD FOR FORMING INSULATING FILM

BACKGROUND OF THE INVENTION

1. Field of the Invention

The present invention relates to a method for forming a borosilicate glass film (hereinafter referred to as a BSG film) by means of a CVD method.

2. Description of the Prior Art

Up to now, a borosilicate glass film (BSG film) has been formed by means of a CVD method under the following conditions of gas and depositing temperature:

(1) $SiH_4+B_2H_6+O_2$ (400° C.)

(2) TEOS+TMB or TEB+$O_2$ (750° C.)

(3) TEOS+TMB or TEB+$O_2$ (400° C.), and the like.

However, the as-depo film according to the above CVD method is mixed with $B_2O_3+SiO_2$, and is not of glass structure. The as-depo means a state which is immediately after the deposition. This film is poor in denseness and high in hygroscopicity. Particularly, when the concentration of boron in the film exceeds 5 to 6 wt %, it abruptly becomes high in hygroscopicity. Therefore, it is not suitable for application to manufacturing process of a semiconductor device and the like.

To improve this problem, the film can be changed to glass structure by heating the as-depo film at a high temperature of 800° C. or higher.

However, a high-temperature heat treatment needs some extra equipment and requires much time and labor, and some processes and interconnection materials used for manufacturing a semiconductor are subject to restrictions due to its treatment. Thereby, this method for forming a film has been kept from being applied to a process for manufacturing a semiconductor device.

SUMMARY OF THE INVENTION

An object of the invention is to provide a method for forming a film by which a BSG film with high denseness and low hygroscopicity can be obtained even immediately after the deposition at a low temperature.

The inventors of the invention considered how an asdepo film of $B_2O_3+SiO_2$ is transformed to the film of glass structure by heat treatment at a high temperature. It led to a conclusion that bond of Si—O—B was formed due to a high temperature.

A film forming method of the invention forms a BSG film, using a mixed gas which consists of an organometallic compound having bond of Si—O—B (SLOB source) and ozone ($O_3$). With this, bond of Si—O—B is taken into the formed BSG film as its component as it is, and the as-depo BSG film has a glass structure. Accordingly, the as-depo BSG film is high in denseness and low in hygroscopicity.

Furthermore, since the SiOB source becomes easy to be decomposed due to using $O_3$, it is possible to form a BSG film having Si—O—B bond in an as-depo state even in case that a depositing temperature is as low as 400° C. or lower.

Thus, a film forming method of the invention can be applied to manufacturing process of a semiconductor device without being subject to restriction in its manufacturing process and without requiring some extra equipment or some extra time and labor.

And it is possible to more finely control the concentration of B by adding TEOS.

BRIEF DESCRIPTION OF THE DRAWINGS

FIG. 5 is a characteristic diagram showing dependence of moisture content in an as-depo BSG film upon an additive ratio of $O_3$ in $O_2$ according to the embodiment of the invention.

FIGS. 6, 7, 8, 9 are diagrams showing general chemical formulas and constitutional formulas of organometallic compounds having Si—O—B bond according to the embodiment of the invention.

DESCRIPTION OF THE PREFERRED EMBODIMENT OF THE INVENTION

Figure 1:
FIG. 1 is a cross-sectional view showing a state of forming a BSG film on the surface of a wafer according to the embodiment of the invention.
Figure 1:
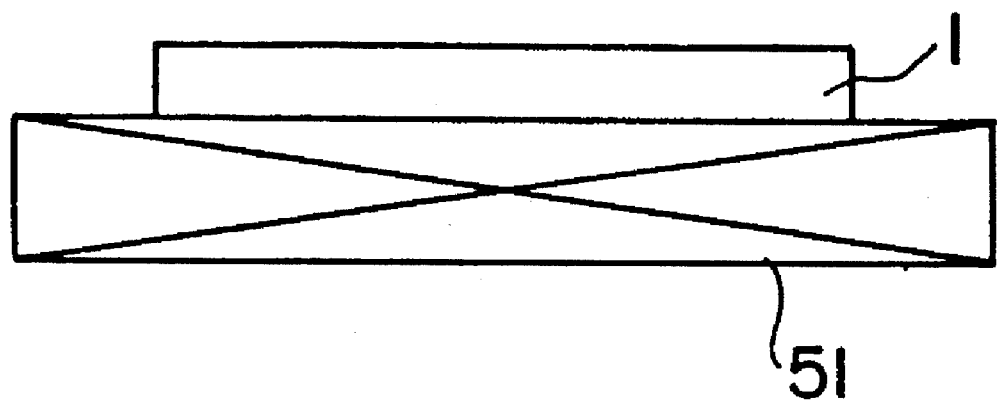

Referring to the drawings, an embodiment of the invention is described in the following. (1) Description of a source gas used in a film forming method of an embodiment of the invention As an SiOB source gas there is an organometallic compound having Si—O—B bond which is expressed by the following general chemical formulas, for example,

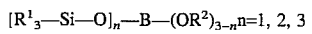

$[R^1{}_3-Si-O]_n-B-(OR^2)_{3-n}$ n=1, 2, 3

(hereinafter referred to as SiOB source), where $R^1$ and $R^2$ represent an alkyl group, an aryl group, or some similar organic group. An alkyl group is an atomic group obtained by removing one hydrogen atom from a paraffin hydrocarbon and is represented by a general chemical formula of $C_nH_{2n+1}$, and includes a methyl group ($CH_3$), an ethyl group ($C_2H_5$), and the like. And an aryl group is a generic name of the residual groups obtained by removing one hydrogen atom from the nucleus of aromatic hydrocarbon, and includes a phenyl group ($C_6H_5-$) and the like. There is tris-trimethylsilylborate as the most typical example of an SiOB source having alkyl groups, where $R^1$ is a methyl group and n=3 and this is represented by a constitutional formula of

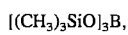

Figure 2A:
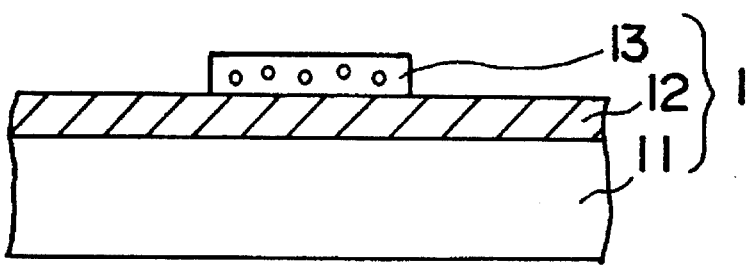
FIGS. 2A, 2B, 2C are cross-sectional views showing a method for forming a BSG film as an interlayer insulating film to cover a lower interconnection layer according to the embodiment of the invention.
Figure 2B:
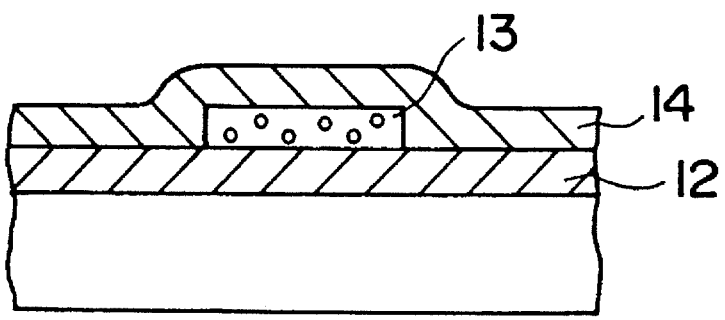
Figure 2C:
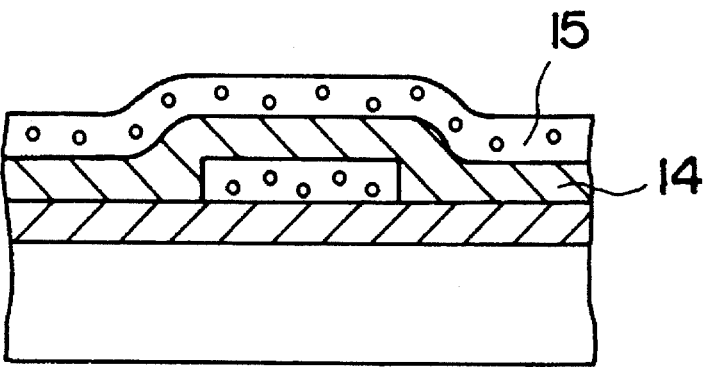

$[(CH_3)_3SiO]_3B$, as shown in No.1 of FIG. 6. In FIG. 6, R represents an alkyl group, an aryl group, or some organic group similar to them, and a case that R is a methyl group is shown as each concrete example. This SiOB source has a boiling point of 184.5° C., which is nearly equal to that of TEOS, and is a publicly known material very easy to use. A CVD method thermally decomposing the SiOB source gas at a temperature of 700° C. or higher and a plasma-assisted CVD method are known as examples of CVD methods using an SiOB source gas having the SiOB source contained in a carrier gas. And it is possible also to use SiOB sources as represented by general chemical formulas and constitutional formulas as shown in FIGS. 6 to 9 instead of the above-mentioned SiOB source. A mixed gas obtained by adding ozone ($O_3$) for oxidizing and decomposing the SiOB source to the above-mentioned SiOB source gas is used as a reactive gas in a CVD method. The SiOB source is promoted to be decomposed and can be thermally decomposed at a low temperature of 400° C. or lower. In case of using O₂ instead of O₃, a high temperature of 700° C. or higher is needed to thermally decompose the SiOB source. (2) Description of a film forming method according to an embodiment of the invention A method for forming a BSG film on a semiconductor substrate by means of a CVD method using a mixed gas of the above-mentioned SiOB source and ozone (O₃) according to an embodiment of the invention is described as referring to FIG. 1 and FIGS. 2A to 2C. FIG. 1 is a cross-sectional view showing a state of forming a BSG film on the surface of a wafer 1 on a wafer holder 51. FIGS. 2A to 2C are cross-sectional views showing a method for forming a BSG film 14 as an interlayer insulating film to cover a lower interconnection layer 13. In this case, the above-mentioned tris-trimethylsilylborate represented by a constitutional formula

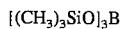

is used as an SiOB source, and a mixed gas obtained by adding ozone (O₃) to this tris-trimethylsilylborate

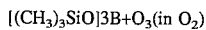

is used as a reaction gas. O₃ is contained at a predetermined additive rate in O₂.

First, a wafer (substrate) 1 is entered into a reaction chamber of an atmospheric pressure CVD apparatus, is set on a wafer holder 51 shown in FIG. 1, and is heated as keeping its temperature at 400° C. or lower, provided that in the wafer 1 a backing insulating film 12 made of a silicon oxide film has been already formed on a semiconductor substrate 11 and furthermore a lower interconnection layer 13 made of an Al film has been formed on the backing insulating film 12.

Next, a mixed Gas of an SiOB source gas having an SiOB source contained in such a carrier gas as N₂ having a specified flow rate and O₃ added by a specified additive ratio is introduced into the reaction chamber as a reaction gas.

This gas-introducing state is kept for a specified time as shown in FIG. 1. By this a BSG film 14 with specified thickness is formed on the wafer 1 as shown in FIG. 2B. At this time, since temperature of the wafer 1 is 400° C. or lower, it is possible to form an interlayer insulating film in a state where a lower interconnection layer 13 made of an Al film has been formed and to prevent the Al film from being subjected to a great thermal stress.

After this an upper interconnection layer 15 made of an Al film and the like is formed on the BSG film 14 as shown in FIG. 2C.

The BSG film 14 formed in the above-mentioned manner was investigated for its film quality and other characteristics.

The BSG film 14 formed in the above-mentioned manner proved to contain B of 15 to 18 mol % (equivalent to 5 to 6 wt %) in it. By the way, as shown in FIG. 6, an Si/B ratio of the SiOB source is 3 and the ratio of B contained in the BSG film 14 is very near to its theoretical ratio (16.3 mol %).

In this way, since the content of B contained in the BSG film 14 is determined almost according to an Si/B ratio in the SiOB source gas, the B can be doped accurately in concentration. And it is possible also to more finely adjust the concentration of B by adding TEOS.

A BSG film containing so much B made by a film forming method of the prior art becomes nebular in its surface due to its moisture absorption immediately after forming the film, but on the other hand a BSG film according to this embodiment was very stable and did not absorbed moisture when it was left in the air for a short time. Furthermore, no abnormal state was found on the surface of the BSG film even after it was left in the air for a long time. It is thought that this is because the BSG film was improved in denseness by forming strong Si—O—B bond in it and so its moisture absorption was obstructed.

Furthermore, the formed BSG film 14 has not only a stable film surface and good film quality as described above but also a high anti-crack ability. For example, the BSG film 14 of about 3 um in thickness was crack-free.

And since the BSG film 14 grows isotropically, it is excellent in step coverage.

Next, referring to FIGS. 3 and 4, film forming data of the BSG film obtained by the above-mentioned film forming method is described in the following.

Figure 3:
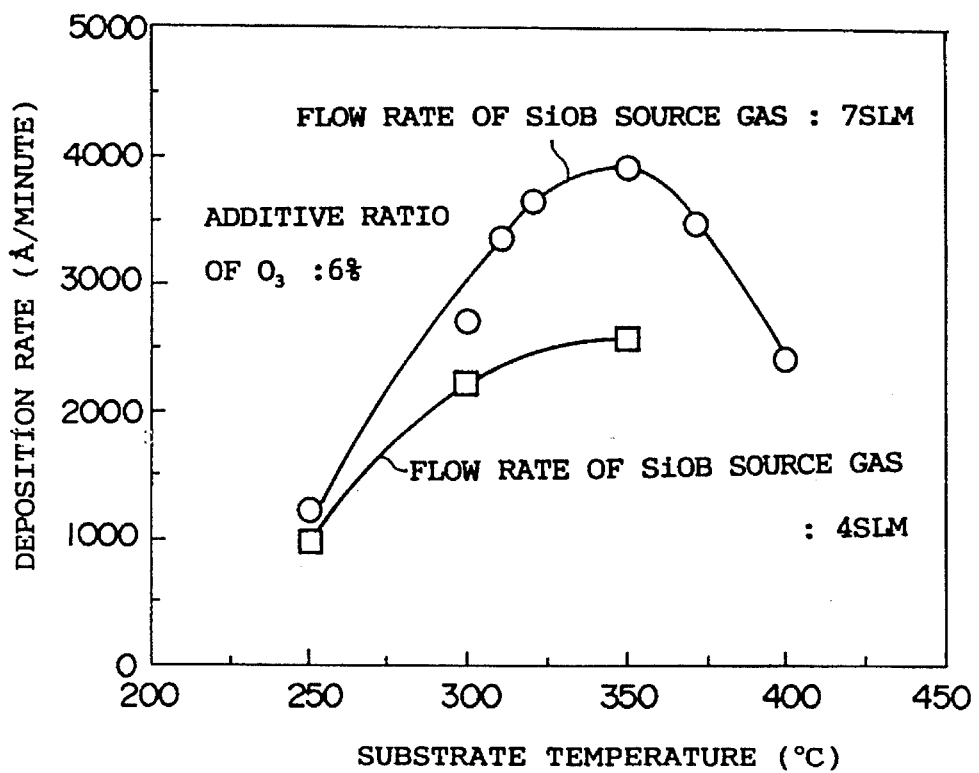
FIG. 3 is a characteristic diagram showing dependence of a deposition rate of a BSG film upon its depositing temperature according to the embodiment of the invention.

FIG. 3 is a characteristic diagram showing dependence of a deposition rate of the film upon its depositing temperature. The axis of abscissas represents the depositing temperature(° C.), and the axis of ordinates represents the deposition rate(Å/minute). In FIG. 3, the depositing temperature is in a range from 250° C. to 400 ° C., and other conditions are 4 SLM and 7 SLM in flow rate of the SiOB source gas and 6% in additive quantity of O₃.

According to the result, in case that the flow rate of the SiOB source gas is 7 SLM, the deposition rate is about 1000 Å/minute and becomes greater as the temperature becomes higher, and reaches its maximum of about 4000 Å/minute at the depositing temperature of 350° C., and after this it decreases as the temperature becomes still higher and becomes about 2500 Å/minute at the depositing temperature of 400° C. And in case that the flow rate of the SiOB source gas is 4 SLM, a trend similar to this appears and the deposition rate reaches its maximum of about 2600 Å/minute at 350° C. FIG. 4 is a characteristic diagram showing dependence of a deposition rate of the film upon a flow rate of the SiOB source gas. The axis of abscissas represents a flow rate of the SiOB source gas (SLM), and the axis of ordinates represents the deposition rate (Å/minute). In FIG. 4, the flow rate of the SiOB source gas is in a range from 2 SLM to 9 SLM, and other conditions are 400° C. in depositing temperature and 5.6% in additive ratio of O₃ in O₂.

According to the result, in case that the flow rate of the SiOB source Gas is 2 SLM, the deposition rate is about 800 Å/minute and becomes rapidly Greater as the flow rate of the SiOB source Gas becomes Greater, and reaches about 1900 Å/minute at 6 SLM in flow rate of the SiOB source Gas, and after this the deposition rate increases Gradually as the flow rate of the SiOB source Gas becomes Greater and it becomes about 2000 Å/minute at 9 SLM in flow rate of the SiOB source gas.

Figure 4:
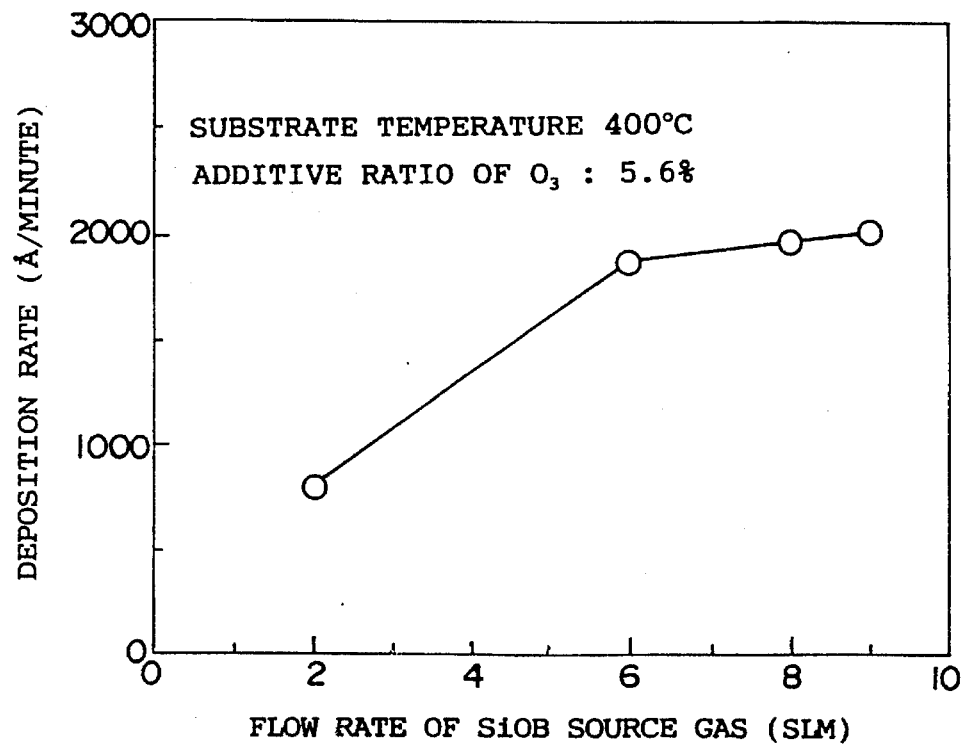
FIG. 4 is a characteristic diagram showing dependence of a deposition rate of a BSG film upon a flow rate of an SiOB gas according to the embodiment of the invention.

Thus, from values of the deposition rate shown in FIGS. 3 and 4, it has been found that the embodiment of the invention can be adequately applied to a semiconductor device by choosing a proper gas condition and a proper condition of depositing temperature.

As referring to FIG. 5, characteristics of the BSG film 14 formed by means of the above-mentioned film forming method are described as follows. FIG. 5 is a characteristic diagram showing dependence of moisture content of the as-depo BSG film 14 upon an additive ratio of O₃ in O₂.

The axis of abscissas represents the additive ratio of O₃ (%), and the axis of ordinates represents the moisture content (wt %). In FIG. 5, the additive ratio of O₃ in O₂ is in a range from 1% to 5.6% under a condition of 400° C. in depositing temperature and of 8 SLM in flow rate of the SiOB source Gas. In this case, the sample was left in the air for 6 hours after formation of the film till measurement of it.

According to the result, moisture content of the as-depo BSG film 14 proves to little depend upon an additive ratio of $O_3$.

This moisture content proves that the as-depo BSG film of the embodiment is fairly lower in moisture content as compared with an as-depo BSG film according to a method of the prior art and so it can be adequately applied to manufacturing process of a semiconductor device.

As described above, a film forming method of the embodiment of the invention forms a BSG film 14, using a mixed gas of an organometallic compound having Si—O—B bond and ozone ($O_3$).

Thus, since the as-depo BSG film 14 has Si—O—B bond taken into it as a component of it as it is, the as-depo BSG film 14 comes to be of glass structure and results in being high in denseness and low in hygroscopicity.

Furthermore, since the SiOB source is made easier to be decomposed by using $O_3$, it is possible to form a BSG film 14 having Si—O—B bond in an as-depo state even when depositing temperature is as low as 400° C. or lower.

Therefore, a film forming method of the embodiment of the invention can be applied to manufacturing process of a semiconductor device without restriction of materials used as the interconnection layer and without extra equipment or extra time and labor.

Besides, the above-mentioned embodiment forms the BSG film 14 using a mixed gas of an organometallic compound having Si—O—B bond and ozone ($O_3$), but it can also use another mixed gas obtained by adding tetra-ethylorthosilicate (TEOS) to these gases. By this, it is possible to adjust more finely the concentration of B in the BSG film to be formed.

Further, the BSG film is formed by means of an atmospheric-pressure CVD method, but it can be also formed by means of a depressurized CVD method.

Moreover, the BSG film is formed on the interconnection layer made of Al, but it may be formed on an interconnection layer made of Al alloy containing at least one selected from group of Si, Cu and the like, other metal or a polycrystalline silicon.

What is claimed is:

1. A method for forming a film, comprising forming a borosilicate glass film on a substrate using a mixed gas of an organometallic compound having a Si—O—B bond and ozone.

2. The method for forming a film as defined in claim 1, wherein the organometallic compound having Si—O—B bond is represented by a general chemical formula:

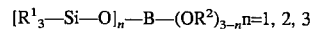

$$[R^1{}_3\text{—Si—O}]_n\text{—B—}(OR^2)_{3-n} \quad n=1, 2, 3$$

where each of $R^1$ and $R^2$ is selected from the group consisting of an alkyl group and an aryl group.

3. The method for forming a film as defined in claim 1, wherein the substrate is held at a temperature of 400° C. or lower while forming the film.

4. The method for forming a film as defined in claim 1, wherein the substrate is provided by forming an insulating film on a semiconductor layer and an interconnection layer on the insulating film.

5. The method for forming a film as defined in claim 4, wherein the insulating film is a silicon oxide film.

6. The method for forming a film as defined in claim 4, wherein the interconnection layer is one of an Al film and an Al alloy film.

7. A method for forming a film, comprising forming a borosilicate glass film on a substrate using a mixed gas of an organometallic compound having a Si—O—B bond and tetra-ethylorthosilicate and ozone.

8. The method for forming a film as defined in claim 7, wherein the organometallic compound having Si—O—B bond is represented by a general chemical formula:

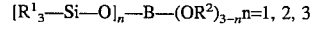

$$[R^1{}_3\text{—Si—O}]_n\text{—B—}(OR^2)_{3-n} \quad n=1, 2, 3$$

where each of $R^1$ and $R^2$ is selected from the group consisting of an alkyl group and an aryl group.

9. The method for forming a film as defined in claim 7, wherein the substrate is held at a temperature of 400° C. or lower while forming the film.

10. The method for forming a film as defined in claim 7, wherein the substrate is provided by forming an insulating film on a semiconductor layer and an interconnection layer on the insulating film.

11. The method for forming a film as defined in claim 10, wherein the insulating film is a silicon oxide film.

12. The method for forming a film as defined in claim 10, wherein the interconnection layer is one of an Al film and an Al alloy film.

* * * * *

UNITED STATES PATENT AND TRADEMARK OFFICE
CERTIFICATE OF CORRECTION

PATENT NO. : 5,532,193
DATED : July 2, 1996
INVENTOR(S) : MAEDA et al

It is certified that error appears in the above-indentified patent and that said Letters Patent is hereby corrected as shown below:

Col. 1, line 44, "asdepo" should read --as-depo--; and
      line 52, "SLOB" should read --SiOB--.

Col. 2, line 30, begin a new paragraph with "(1)";
      line 32, begin a new paragraph with "As";
      line 35, after "$_{3-n}$" insert a space before "n=1,";
      line 47, begin a new paragraph with "There";
      line 57, begin a new paragraph with "This";
      line 63, begin a new paragraph with "And"; and
      line 67, begin a new paragraph with "A".

Col. 3, line 5, begin a new paragraph with "In";
      line 7, begin a new paragraph with "(2)";
      line 8, begin a new paragraph with "A";
      line 13, begin a new paragraph with "FIG.";
      line 25, "SiO]3" should read --SiO]$_3$--.

Col. 4, line 46, "Gas" should read --gas--;
      line 47, "Greater" should read --greater--;
      line 48, "Gas" should read --gas-- and "Greater" should read --greater--;

UNITED STATES PATENT AND TRADEMARK OFFICE
CERTIFICATE OF CORRECTION

PATENT NO. : 5,532,193
DATED : July 2, 1996
INVENTOR(S) : MAEDA et al

It is certified that error appears in the above-indentified patent and that said Letters Patent is hereby corrected as shown below:

line 49, "Gas" should read --gas--;

line 50, "Gradually" should read --gradually--;

line 51, "Gas" should read --gas-- and "Greater" should read --greater--.

Col. 5, line 2, "Gas" should read --gas--.

Col. 6, line 6, after "$_{3-n}$" insert a space before "n=1,"; and line 30, after "$_{3-n}$" insert a space before "n=1,".

Signed and Sealed this

Eleventh Day of March, 1997

*Attest:*

BRUCE LEHMAN

*Attesting Officer*     *Commissioner of Patents and Trademarks*